(12) United States Patent
Zhang et al.

(10) Patent No.: US 12,189,005 B1
(45) Date of Patent: Jan. 7, 2025

(54) OPTICALLY PUMPED ATOMIC BEAM APPARATUS BASED ON CURVED FOUR CONDUCTORS

(71) Applicant: National Time Service Center, Chinese Academy of Sciences, Xi'an (CN)

(72) Inventors: Shougang Zhang, Xi'an (CN); Fuyu Sun, Xi'an (CN); Chao Li, Xi'an (CN); Xuwen Hu, Xi'an (CN); Jie Liu, Xi'an (CN); Xiaofeng Li, Xi'an (CN)

(73) Assignee: National Time Service Center, Chinese Academy of Sciences, Xi'an (CN)

( * ) Notice: Subject to any disclaimer, the term of this patent is extended or adjusted under 35 U.S.C. 154(b) by 0 days.

(21) Appl. No.: 18/806,722

(22) Filed: Aug. 16, 2024

(30) Foreign Application Priority Data

Feb. 27, 2024 (CN) .......................... 202410215751.9

(51) Int. Cl.
*G01R 33/26* (2006.01)

(52) U.S. Cl.
CPC .................................. *G01R 33/26* (2013.01)

(58) Field of Classification Search
CPC ....................................................... G01R 33/26
See application file for complete search history.

(56) References Cited

U.S. PATENT DOCUMENTS

| 5,146,185 A * | 9/1992 | Lewis | H03L 7/26 372/2 |
| 10,630,302 B2 * | 4/2020 | Denis | H03L 7/26 |
| 2009/0302957 A1 * | 12/2009 | Levi | G04F 5/145 331/94.1 |
| 2013/0335154 A1 * | 12/2013 | Marmet | H03L 7/26 331/94.1 |

FOREIGN PATENT DOCUMENTS

CN 115685722 A * 2/2023

* cited by examiner

*Primary Examiner* — Jay Patidar (57) ABSTRACT

An optically pumped atomic beam apparatus based on curved four conductors includes a vacuum chamber; and a magnetic shielding chamber, a beam source device, a curved four-conductor static magnetic field generation structure, a microwave cavity, and a fluorescence collection device are disposed in the vacuum chamber. The curved four-conductor static magnetic field generation structure is composed of the curved four conductors with same shapes and sizes, and the curved four conductors are symmetrically arranged by taking an atomic beam as a center axis; a middle portion of each of the curved four conductors is a straight section, and two end portions of each of the curved four conductors are two curved sections bent towards the atomic beam; and a rectangle is formed by intersecting any plane perpendicular to the atomic beam with the curved four conductors, and a length-width ratio of each rectangle is the same.

6 Claims, 4 Drawing Sheets

OPTICALLY PUMPED ATOMIC BEAM APPARATUS BASED ON CURVED FOUR CONDUCTORS

CROSS-REFERENCE TO RELATED APPLICATION

This application claims priority to a Chinese patent application No. 202410215751.9, filed to China National Intellectual Property Administration (CNIPA) on Feb. 27, 2024, which is herein incorporated by reference in its entirety.

TECHNICAL FIELD

The disclosure relates to the field of quantum precision measurement, particularly to an optically pumped atomic beam apparatus based on curved four conductors.

BACKGROUND

An atomic beam apparatus significantly reduces an influence of atomic collision on an atomic transition frequency, and is widely used in the field of quantum precision measurement such as an atomic clock and an atom interferometer. In the atomic beam apparatus, it is essential to provide a highly uniform static magnetic field, which can cover atomic beams and can provide a quantization axis for the atomic transition. Homogeneity of a spatial distribution of the static magnetic field directly affects the atomic transition.

According to different directions of the static magnetic field, existing atomic beam apparatuses are mainly divided into an atomic beam apparatus based on a solenoid and an atomic beam apparatus based on straight four conductors. Specifically, the solenoid can generate a longitudinal static magnetic field parallel to a direction of an atomic trajectory, and the homogeneity of the static magnetic field generated by the solenoid can be improved by increasing a length and a diameter of the solenoid. The above manipulation for the longitudinal static magnetic field is suitable for the space insensitive applications; and if the volume of beam apparatus is strictly confined, the homogeneity of the spatial distribution of the static magnetic field can be improved by adding a compensation coil or adjusting coil spacing. The straight four conductors can generate a transverse static magnetic field perpendicular to a direction of the atomic trajectory, and the homogeneity of the spatial distribution of the static magnetic field generated by the straight four conductors can be improved by increasing a length of each of the straight four conductors and the spacing between two adjacent straight conductors. However, in space-confined applications, it remains a significant technical challenge to generate a highly uniform transverse static magnetic field using the straight four conductors with limited length, hindering the construction of the high-performance atomic beam apparatus based on the four-conductor configuration.

SUMMARY

In order to solve the above problems existing in the related art, the disclosure provides an optically pumped atomic beam apparatus based on curved four conductors.

A technical problem to be solved by the disclosure is achieved by the following technical solution.

The optically pumped atomic beam apparatus based on the curved four conductors includes a vacuum chamber and multiple components disposed in the vacuum chamber.

The multiple components includes:

a beam source device, configured to generate an atomic beam that is perpendicular to and intersects with a pumping laser fed from outside the optically pumped atomic beam apparatus, and can achieve state purification of the atomic beam under the action of the pumping laser;

a magnetic shielding chamber, configured to shield external environmental magnetic fields;

a curved four-conductor static magnetic field generation structure, configured to generate a static magnetic field under excitation of a working current; where the curved four-conductor static magnetic field generation structure includes the curved four conductors with same shapes and sizes; the curved four conductors are symmetrically arranged with the atomic beam as a center axis; a middle portion of each of the curved four conductors is a straight section, and two end portions of each of the curved four conductors are two curved sections bent towards the atomic beam; and each of multiple planes perpendicular to the atomic beam intersects with the curved four conductors to form four intersection points, the four intersection points corresponding to each plane form a rectangle with the four intersection points as four vertices of the rectangle to thereby define multiple rectangles corresponding to the multiple planes, and a length-width ratio of each rectangle of the multiple rectangles is the same;

a microwave cavity, configured to generate a microwave field under excitation of an external microwave signal, where the microwave field is configured to excite magnetic resonance transition of the atomic beam; and a fluorescence collection device, configured to collect fluorescence photons to extract a magnetic resonance transition signal for the magnetic resonance transition, where the atomic beam undergoing the magnetic resonance transition perpendicularly intersects with a detection laser fed from outside the optically pumped atomic beam apparatus, and the fluorescence photons are generated under the action of the detection laser.

In an embodiment, the curved four conductors, the microwave cavity, and the fluorescence collection device are disposed in the magnetic shielding chamber; and the beam source device is disposed between the vacuum chamber and the magnetic shielding chamber.

In an embodiment, each of the curved four conductors includes one or more wires.

In an embodiment, a distribution of the static magnetic field is customized by pre-designing a length of the straight section corresponding to the middle portion of each of the curved four conductors, an arc radius of each of the two curved sections corresponding to the two end portions of each of the curved four conductors, and the number of wires contained in each curved conductor of the curved four conductors and spacing between two adjacent curved conductors of the curved four conductors.

In an embodiment, the working current is applied to the curved four-conductor static magnetic field generation structure through the following steps:

applying first constant currents with equivalent values and same directions to a group of curved conductors of the curved four conductors in the curved four-conductor static magnetic field generation structure, and applying second constant currents with equivalent values and same directions to the other group of curved conductors of the curved four conductors in the curved four-conductor static magnetic field generation structure.

In an embodiment, the group of conductors consists of two conductors, with the spacing between these two conductors equal to the width of the rectangle; the other group of conductors consists of two conductors apart from the aforementioned two conductors. The magnitudes of both the first and second constant currents are equal, but their directions are opposite.

In an embodiment, the length-width ratio of each rectangle is $\sqrt{3}$.

In an embodiment, an intensity of the static magnetic field is adjusted by changing an intensity of the working current.

When the working current is applied to the curved four-conductor static magnetic field generation structure, the static magnetic field generated inside the optically pumped atomic beam apparatus based on the curved four conductors according to the disclosure provides the quantization axis for atomic transition. Specifically, since the two end portions of each curved conductor contained in the curved four-conductor static magnetic field generation structure are bent towards the atomic beam and are positioned closer to the atomic beam the intensity of the static magnetic field generated on the end portions of the atomic beam is enhanced. Therefore, an attenuation of the static magnetic field generated by the traditional straight four conductors in a corresponding region is compensated. Namely, the disclosure can achieve the better homogeneity of the static magnetic field and provide a larger uniform region for the static magnetic field in a confined space, thereby reducing the frequency deviation of atomic transition n caused by inhomogeneity of the static magnetic field.

In addition, when the static magnetic field is generated by using the curved four-conductor static magnetic field generation structure according to the disclosure, the curved four-conductor static magnetic field generation structure illustrates strong ability of field distribution manipulation, thereby providing a new method for generating a highly uniform spatial distribution of static magnetic field.

BRIEF DESCRIPTION OF DRAWINGS

The disclosure will be further described in detail below with reference to attached drawings.

Description of reference signs are as follows:
  1—vacuum chamber; 2—beam source device; 3—atomic beam; 4—curved conductor; 5—first laser transmission hole; 6—microwave cavity; 7—fluorescence collection device; 8—second laser transmission hole; 9—magnetic shielding chamber.

DETAILED DESCRIPTION OF EMBODIMENTS

The disclosure will be further described in detail below with reference to illustrated embodiments, but implementations of the disclosure are not limited thereto.

Figure 1:
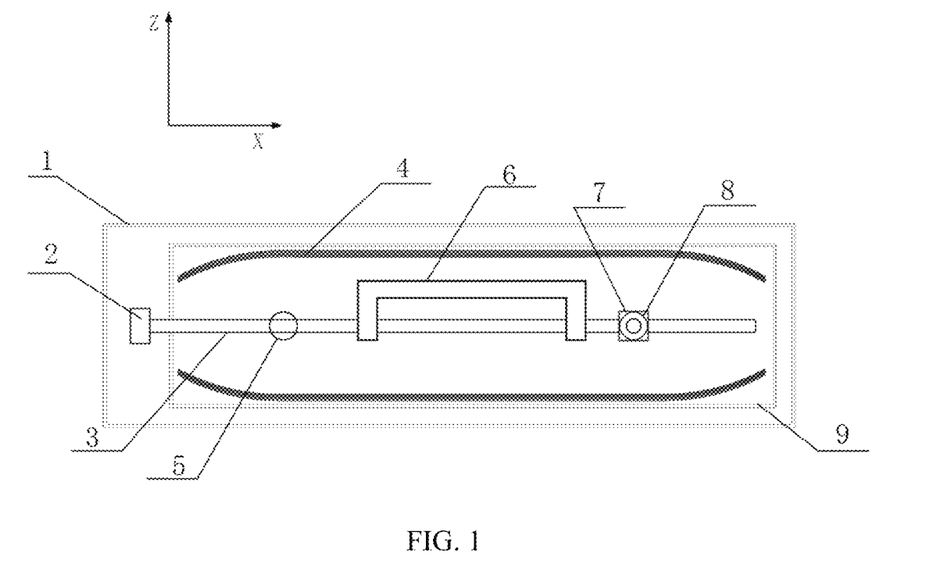
FIG. 1 illustrates a front perspective view of an optically pumped atomic beam apparatus based on curved four conductors according to an embodiment of the disclosure.

In order to obtain better homogeneity of a static magnetic field or a larger uniform region within a confined space, and to reduce the frequency deviation of atomic transition caused by field inhomogeneity, an embodiment of the present disclosure provides an optically pumped atomic beam apparatus based on curved four conductors. Specifically, FIG. 1 illustrates a front perspective view of the optically pumped atomic beam apparatus, which includes a vacuum chamber 1, a magnetic shielding chamber 9, a beam source device 2, a curved four-conductor static magnetic field generation structure composed of four curved conductors 4 (also referred to the optically pumped atomic beam apparatus based on the curved four conductors), a microwave cavity 6, and a fluorescence collection device 7, all arranged within the vacuum chamber 1.

Specifically, the beam source device 2 generates an atomic beam 3, which intersects perpendicularly with an externally provided pumping laser, enabling state purification of the atomic beam 3. In an illustrated embodiment, an intersection region between the atomic beam 3 and the pumping laser is a pumping region; and the pumping laser is fed into the vacuum chamber 1 through a first laser transmission hole 5 defined on the vacuum chamber 1. Hereinafter, the atomic beam 3 generated by the beam source device 2 is a highly collimated atomic beam.

The curved four-conductor static magnetic field generation structure is configured to generate the static magnetic field when excited by the working current; this structure consists of four curved conductors 4 of identical shape and size; the four curved conductors 4 are symmetrically arranged in the vacuum chamber 1 by taking the atomic beam 3 as a center axis; a middle section of each of the four curved conductors 4 is straight, while both ends bend towards the atomic beam 3. Specifically, multiple planes perpendicular to the atomic beam 3 intersect with the four curved conductors 4 at four points, forming rectangles with consistent length-width ratios h/w, where w represents a width of the corresponding rectangle, and h represents a length of the corresponding rectangle (also referred as a height of the corresponding rectangle shown in FIG. 2). As shown in FIG. 1, a plane perpendicular to the atomic beam 3 represents a Y-Z plane, a Y direction of which illustrates a direction perpendicular to the plane shown in FIG. 1.

Figure 2:
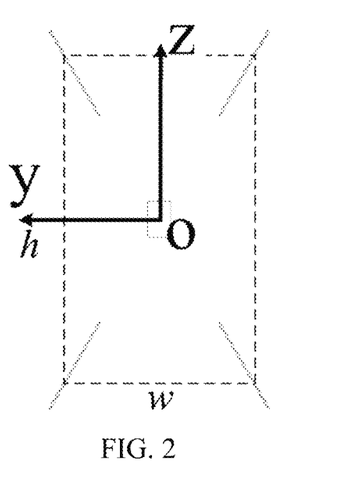
FIG. 2 illustrates a schematic diagram of a symmetric distribution of the curved four conductors with an atomic beam as a center axis according to the embodiment of the disclosure.

As shown in FIG. 2, the atomic beam 3 is centrally located within the curved four-conductor static magnetic field generation structure; the four curved conductors 4 are symmetrically arranged around the atomic beam 3 as the central axis, and the Y-Z plane, which is perpendicular to the atomic beam 3, intersects the four curved conductors 4 at four points that form the vertices of the corresponding rectangle. This rectangle is represented by a dashed box in FIG. 2, and it can be seen that the atomic beam 3 vertically passes through a center point O of the corresponding rectangle. In an illustrated embodiment, the length-width ratio of the rectangle can be $\sqrt{3}$, but it is not limited thereto.

In the embodiment of the disclosure, the method of applying the working current to the curved four-conductor static magnetic field generation structure includes the following step: applying first constant currents (I) of equal value and direction into a group of curved conductors 4, designated as group A, and simultaneously applying a second constant currents (I−) of equal value and direction into the other group of curved conductors 4, designated as group B; the group A includes two curved conductors 4 with spacing equal to the width of the rectangle, while the group B includes the remaining two curved conductors 4. The first and second constant currents (I and I−) have equal intensity but opposite directions.

Figure 3:
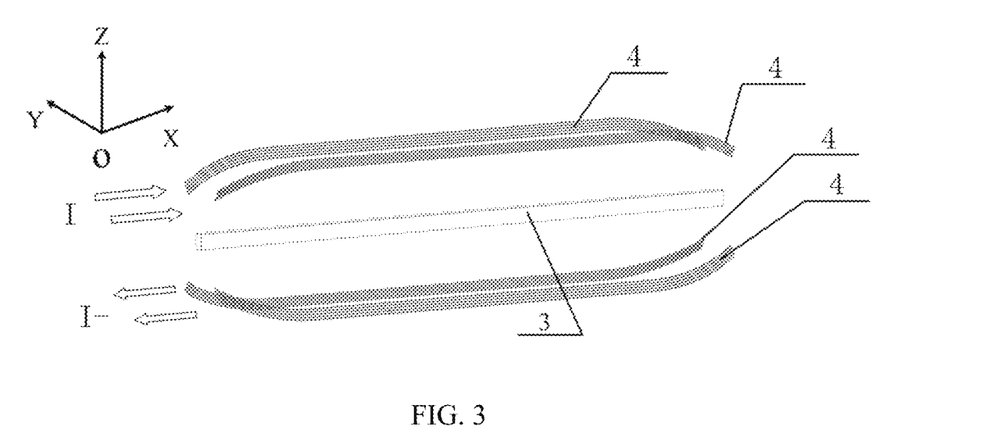
FIG. 3 illustrates a schematic diagram of applying a working current to a curved four-conductor static magnetic field generation structure according to the embodiment of the disclosure.

As shown in FIG. 3, the four curved conductors 4 in the curved four-conductor static magnetic field generation structure are grouped according to their spacing; the curved conductors with a spacing of w are grouped together, while those with a spacing of h are placed in a different group. Thus, the four curved conductors 4 are divided into the two groups, the group A and the group B. The curved conductors in different groups are applied to the constants I and I− of equal value and opposite direction. Specifically, the two curved conductors in the group A receive the first constant current I in the same direction, while the two curved conductors in the group B receive the second constant current I− in the same direction.

As shown in FIG. 3, after applying the working current to the curved four-conductor static magnetic field generation structure, the static magnetic field is generated within the structure; this static magnetic field's direction serves as the quantization axis for the atoms, represented in FIG. 3 as the Y direction.

In the embodiment of the disclosure, each of the four curved conductors 4 may be composed of a wire, for example, each of the four curved conductors 4 can include one or more wires. As shown in FIG. 3, it illustrates that each of the four curved conductors 4 is composed of multiple wires. Certainly, the curved conductors manufactured using other processes may also be applied in the optically pumped atomic beam apparatus provided by the embodiment of the disclosure.

The microwave cavity 6 is configured to generate a microwave field when excited by an external microwave signal; this microwave field induces magnetic resonance transitions in the atomic beam 3.

The fluorescence collection device 7 is configured to collect fluorescence photons to extract a magnetic resonance transition signal of the magnetic resonance transition. Within the fluorescence collection device 7, the atomic beam 3, having completed its magnetic resonance transition, intersects perpendicularly with an externally provided detection laser, generating fluorescence photons. This detection laser enters the vacuum chamber 1 through a second laser transmission hole 8.

The magnetic shielding chamber 9 is configured to shield external environmental magnetic fields; the curved four-conductor static magnetic field generation structure is disposed within the magnetic shielding chamber 9; the magnetic shielding chamber 9 features holes for feeding the introductions of pumping laser and detection laser, corresponding to the positions of the first laser transmission hole 5 and the second laser transmission hole 8 on the vacuum chamber 1, respectively.

Specifically, the vacuum chamber 1 provides a vacuum environment; and the magnetic shielding chamber 9 provides a magnetically shielded environment for the curved four-conductor static magnetic field generation structure, thereby suppressing an influence of external magnetic fields on the static magnetic field generated by the curved four-conductor static magnetic field generation structure. In an illustrated embodiment, the magnetic shielding chamber 9 is made of permalloy, but the material of the magnetic shielding chamber 9 is not limited thereto.

It should be noted that, in practice, there are many specific implementations for providing a vacuum environment and a magnetic shielding environment for the optically pumped atomic beam apparatus, and details are not described in the embodiment of the disclosure.

A working principle of the optically pumped atomic beam apparatus in this embodiment of the disclosure is as follows.

The beam source device 2 generates a highly collimated atomic beam, which enters the uniform static magnetic field formed by the curved four-conductor static magnetic field generation structure. Within this field, the atomic beam 3 intersects perpendicularly with the pumping laser in the pumping region. This allows for state purification of the atomic beam 3 through optical pumping, ensuring that all atoms in the ground state occupy a single ground state level, creating conditions for subsequent magnetic resonance transitions. The atoms in the single ground state level then enter the microwave cavity 6. When the frequency of the microwave signal matches the transition frequency between the atomic ground state levels, magnetic resonance transitions occur. The atomic beam 3, having completed the magnetic resonance transition, intersects perpendicularly with the detection laser in the fluorescence collection device 7, where the atoms emit fluorescence photons. The fluorescence collection device 7 collects these photons to extract the magnetic resonance transition signal. The position where the atomic beam intersects perpendicularly with the detection laser is referred to as the detection region. Therefore, the static magnetic field generated by the curved four-conductor static magnetic field generation structure covers the pumping region, the microwave cavity 6, and the detection region.

In an illustrated embodiment, the optically pumped atomic beam apparatus is provided. Within the vacuum chamber 1, a cesium (Cs) oven acts as the beam source device 2, generating a highly collimated Cs atomic beam. The four curved conductors 4 in the curved four-conductor static magnetic field generation structure produce a transverse static magnetic field in the direction of atomic motion when fed with constant currents. The Cs atomic beam then intersects perpendicularly with single-frequency pumping laser locked to the Cs atomic transition line at 852 nanometers (nm): 4→4', forming the pumping region. This pumping laser is introduced into the pumping region through the first laser transmission hole 5 in the vacuum chamber 1 and a hole in the magnetic shielding chamber 9. Interaction between the Cs atoms and the pumping laser achieves atomic state purification.

Then, the state-purified Cs atoms enter the microwave cavity 6. When the frequency of the microwave field in the cavity matches the Cs atomic clock transition frequency of 9.192631770 gigahertz (GHz), clock transitions occur in the Cs atoms. This microwave field is generated by an external microwave signal fed into the microwave cavity 6 by an external microwave signal source.

After undergoing clock transitions, the Cs atoms enter the fluorescence collection device 7, where they intersect perpendicularly with a single-frequency detection laser locked to the Cs atomic transition line at 852 nm: 4→5', forming the detection region. This detection laser is introduced into the detection region through the second laser transmission hole 8 in the vacuum chamber 1 and a hole in the magnetic shielding chamber 9. In the detection region, the detection laser induces the Cs atoms that have undergone clock transitions to emit fluorescence photons. The fluorescence collection device 7 collects these photons as the output signal of the optically pumped Cs atomic beam apparatus, representing the magnetic resonance transition signal.

In summary, the optically pumped atomic beam apparatus based on the curved four conductors, as provided by the embodiment of the disclosure, generates a static magnetic field that serves as the quantization axis for the atoms when the working current is fed into the curved four-conductor static magnetic field generation structure. The ends of each curved conductor 4 in the structure bend towards and are closer to the atomic beam 3, enhancing the static magnetic field intensity at the ends of the atomic beam 3. This design compensates for the attenuation effect seen with conventional straight four-conductor one. Consequently, the disclosure achieves better static magnetic field homogeneity and a larger uniform region within a limited space, reducing atomic transition frequency deviation caused by static magnetic field inhomogeneity.

Figure 4:
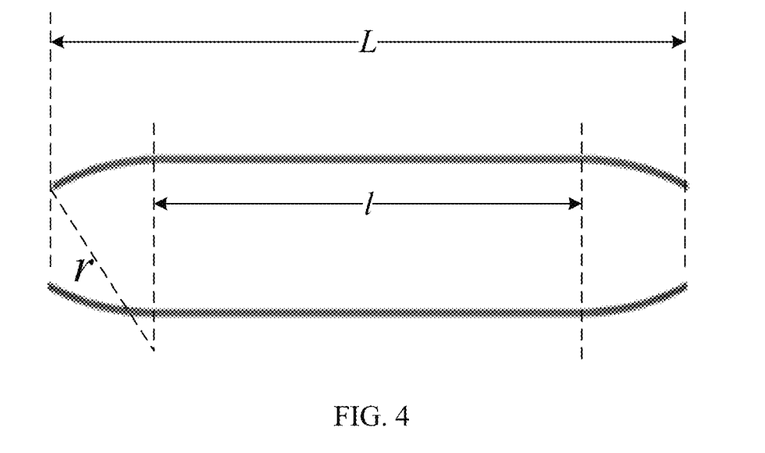
FIG. 4 illustrates a schematic diagram of structural parameters of the curved four-conductor static magnetic field generation structure according to the embodiment of the disclosure.

In the embodiment of the disclosure, as shown in FIG. 2 and FIG. 4, the static magnetic field can be designed by pre-designing a length l of the straight section of each curved conductor 4, an arc radius r of each curved section at the ends of each curved conductor 4, the number of wires included in each curved conductor 4, and the spacing between the adjacent curved conductors 4. The design goal is to achieve the most uniform static magnetic field possible in the pumping region microwave cavity and detection region. During the design process, the fluctuation amplitude $\eta_{max}$ quantifies the best achievable homogeneity given a specific arc radius of the curved portions, while the inhomogeneity n measures the inhomogeneity of the static magnetic field along the direction of the atomic beam 3.

The fluctuation amplitude $\eta_{max}$ of the static magnetic field is expressed as follows:

$$\eta_{max} = \frac{(B_{ymax}(x, y, z) - B_{ymin}(x, y, z))}{B_y(0, 0, 0)}.$$

Specifically, $B_{ymax}(x, y, z)$ and $B_{ymin}(x, y, z)$ represent maximum and minimum values of the spatial static magnetic field in the Y direction respectively; $B_y(0, 0, 0)$ represents a value of the spatial static magnetic field at the origin in the Y direction. Herein, the Y direction corresponds to the quantization axis of the Cs atoms, and the origin is the midpoint (i.e., the center point O of the rectangle) of the Cs atoms' trajectory in the curved four-conductor static magnetic field generation structure.

The inhomogeneity n of the static magnetic field is expressed as follows:

$$\eta = \frac{(B_y(x, y, z) - B_y(0, 0, 0))}{B_y(0, 0, 0)}.$$

Figure 6:
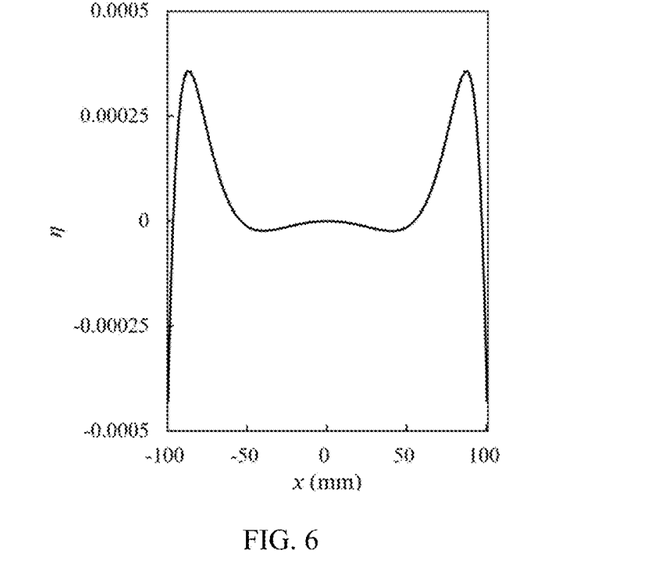
FIG. 6 illustrates inhomogeneity of the static magnetic field generated by the curved four-conductor static magnetic field generation structure in the optically pumped atomic Cs beam apparatus, according to the embodiment of the disclosure when the arc radius r is 0.1 meters (m), the length l is 202.8 millimeters (mm), and each curved conductor is composed of five wires.

Specifically, $B_y(x, y, z)$ represents the spatial static magnetic field in the Y direction, and $B_y(0, 0, 0)$ represents the same as that in the foregoing formula. As shown in FIG. 6, a value of X-axis represents a relative distance between a position on a central axis of the Cs atomic beam and the origin described above, with x=0 indicating the origin.

For the optically pumped Cs atomic beam apparatus described above, the structural parameters of the curved four-conductor static magnetic field generation structure are designed such that the total length of each curved conductor 4 is L=310 millimeters (mm). The shorter spacing between the four curved conductors 4 is w, and the longer spacing is h, with h/w=$\sqrt{3}$. Each curved conductor 4 is composed of five wires.

Figure 5:
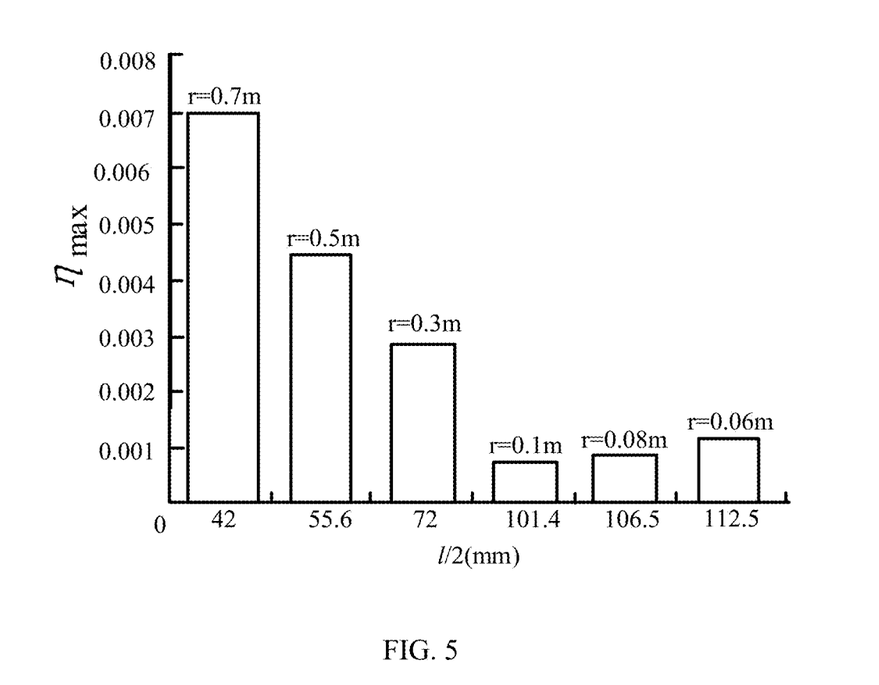
FIG. 5 illustrates a schematic diagram of fluctuation amplitudes of a static magnetic field generated by a curved four-conductor static magnetic field generation structure in an optically pumped atomic cesium (Cs) beam apparatus according to an embodiment of the disclosure under different lengths l and different arc radii r, where each curved conductor is composed of five wires, I represents a length of a straight line corresponding to a middle portion of each curved conductor and r represents an arc radius of each curved section corresponding to two end portions of each curved conductor.

By adjusting the length l of the straight section and the arc radius r of the curved section at the ends of each curved conductor 4, the distribution of the static magnetic field is regulated. FIG. 5 shows a bar chart illustrating the magnetic field fluctuation amplitudes achievable by this curved four-conductor static magnetic field generation structure under different values of r. The X-axis in FIG. 5 indicates the corresponding values of l when the maximum magnetic field fluctuation is achieved. The results in FIG. 5 show that as r decreases, the static field fluctuation first decreases and then increases. When r=0.1 m and l=202.8 mm, the amplitude of the magnetic field fluctuation is only $7.8 \times 10^{-4}$.

FIG. 6 shows the inhomogeneity of the static magnetic field generated by the curved four-conductor static magnetic field generation structure when r=0.1 m and l=202.8 mm. The inhomogeneity is examined within a 200 mm region, covering the pumping region, the microwave cavity 6, and the detection region. From FIG. 6, it is evident that the spatial fluctuation amplitude of the static magnetic field produced by this structure is $7.8 \times 10^{-4}$. When the intensity of the static magnetic field is 60 milligausses (mG), the resultant frequency deviation is less than $2.7 \times 10^{-13}$.

Figure 7:
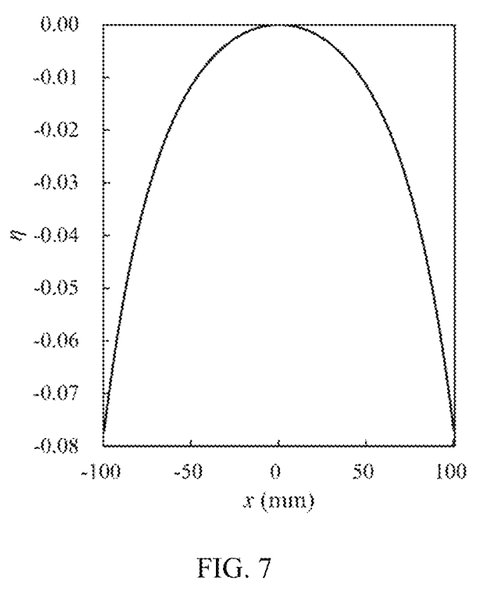
FIG. 7 illustrates inhomogeneity of a static magnetic field generated by an atomic beam apparatus based on straight four conductors, where each conductor is composed of only one wire.

FIG. 7 shows the inhomogeneity of the static magnetic field generated by the atomic beam device based on the straight four conductors. In this structure, the total length of each straight conductor is L=310 mm, with the shorter conductor spacing being w and the longer conductor spacing being h, where h/w=$\sqrt{3}$. Each straight conductor is composed of a single wire. When the same 200 mm region is selected for examination, the inhomogeneity of the static magnetic field in the selected investigation region is only $7.7 \times 10^{-2}$.

Comparing FIG. 6 and FIG. 7, it can be seen that the curved four-conductor static magnetic field generation structure in the embodiment of the disclosure improves the homogeneity of the static magnetic field and expands the spatial homogeneity region, reducing the frequency deviation caused by the inhomogeneity of the static magnetic field. Additionally, this structure effectively regulates the magnetic field distribution without increasing the length or installing additional compensation coils.

According to the embodiment of the disclosure, the objective of effectively regulation the static magnetic field distribution can be achieved by adjusting the structural parameters of the curved four-conductor static magnetic field generation structure. This provides greater flexibility for customizing the static magnetic field distribution, which can be precisely tailored within specific regions to meet various application requirements.

In the embodiment of the disclosure, besides designing the static magnetic field by predefining the length l of the straight section, the arc radius r of the curved section at the end of the curved conductor, the number of wires constituting the curved conductor, and/or the conductor spacing, the static magnetic field strength can also be adjusted by varying the intensity of the working current passing through the curved conductors 4.

It should be noted that the terms "first", "second", etc., are used to distinguish similar objects, and are not necessarily used to describe a specific order or sequence. It should be understood that the data described by the above terms may be interchanged where appropriate, so that the embodiments of the disclosure described herein can be implemented in an order other than those illustrated or described herein. The implementations described in the illustrated embodiments do not represent all implementations consistent with the disclosure. Instead, they are merely specific embodiments of devices and methods consistent with some aspects of the disclosure.

Although the disclosure has been described with reference to various embodiments, in the process of implementing the disclosure, those skilled in the related art can understand and implement other variations of the disclosed embodiments by viewing the attached drawings and the disclosure. In the description of the embodiments of the disclosure, the term "comprising" does not exclude other components or steps, "a" or "an" does not exclude a plurality of cases, and "a plurality of" means two or more, unless otherwise specifically defined. In addition, some implementations are described in different embodiments, which cannot mean that these implementations cannot be combined to produce a better effect.

In the description of the embodiments of the disclosure, the indicated orientation or positional relationship is based on the orientation or positional relationship illustrated in the attached drawings, but is only for the convenience of describing the embodiments of the disclosure and simplifying the description of the disclosure, rather than indicating or implying that the referred device or element must have a specific orientation, and is constructed and operated in a specific orientation, and therefore cannot be understood as a limitation to the embodiments of the disclosure.

The foregoing content is a further detailed description of the embodiments of the disclosure with reference to the illustrated embodiments, and it cannot be determined that the specific implementation of the embodiments of the disclosure is limited to the above description. For those skilled in the related art to which the embodiments of the disclosure belong, several simple deductions or substitutions may be made without departing from the technical concept of the embodiments of the disclosure. However, the simple deductions or substitutions should all be considered as falling within the scope of the protection of the embodiments of the disclosure.

What is claimed is:

1. An optically pumped atomic beam apparatus based on curved four conductors, comprising: a vacuum chamber and the following components disposed in the vacuum chamber:
    a beam source device, configured to generate an atomic beam, wherein the atomic beam is perpendicular to and intersects with a pumping laser fed from outside the optically pumped atomic beam apparatus, and achieves state purification of the atomic beam under action of the pumping laser;
    a magnetic shielding chamber, configured to shield external environmental magnetic fields;
    a curved four-conductor static magnetic field generation structure, configured to generate a static magnetic field under excitation of a working current; wherein the curved four-conductor static magnetic field generation structure comprises curved four conductors with same shapes and sizes; the curved four conductors are symmetrically arranged with the atomic beam as a center axis; a middle portion of each of the curved four conductors is a straight section, and two end portions of each of the curved four conductors are two curved sections bent towards the atomic beam; and each of a plurality of planes perpendicular to the atomic beam intersects with the curved four conductors to form four intersection points, the four intersection points corresponding to each plane form a rectangle with the four intersection points as four vertices of the rectangle to thereby define a plurality of rectangles corresponding to the plurality of planes, and a length-width ratio of each rectangle of the plurality of rectangles is the same;
    a microwave cavity, configured to generate a microwave field under excitation of an external microwave signal, wherein the microwave field is configured to excite the atomic beam to perform magnetic resonance transition; and
    a fluorescence collection device, configured to collect fluorescence photons to extract a magnetic resonance transition signal for the magnetic resonance transition, wherein the atomic beam undergoing the magnetic resonance transition perpendicularly intersects with a detection laser fed from outside the optically pumped atomic beam apparatus, and the fluorescence photons are generated under the action of the detection laser.

2. The optically pumped atomic beam apparatus based on the curved four conductors according to claim 1, wherein each of the curved four conductors comprises one or more wires.

3. The optically pumped atomic beam apparatus based on the curved four conductors according to claim 1, wherein a distribution of the static magnetic field is customized by pre-designing a length of the middle portion of each of the curved four conductors, an arc radius of each of the two curved sections corresponding to the two end portions of each of the curved four conductors, a wire-number of wires contained in each curved conductor of the curved four conductors, and spacing between two adjacent curved conductors of the curved four conductors.

4. The optically pumped atomic beam apparatus based on the curved four conductors according to claim 1, wherein the working current is applied to the curved four-conductor static magnetic field generation structure through the following steps:
    applying first constant currents with equivalent values and same directions to a group of curved conductors of the curved four conductors in the curved four-conductor static magnetic field generation structure, and applying second constant currents with equivalent values and same directions to the other group of curved conductors of the curved four conductors in the curved four-conductor static magnetic field generation structure; and wherein the group of curved conductors are two curved conductors of the curved four conductors, spacing between the two curved conductors is equal to a width of each rectangle, and the other group of curved conductors are the other two curved conductors of the curved four conductors; an intensity of each of the first constant currents is same as an intensity of each of the second constant currents, and the directions of the first constant currents are opposite to the directions of the second constant currents.

5. The optically pumped atomic beam apparatus based on the curved four conductors according to claim 1, wherein the length-width ratio of each rectangle is $\sqrt{3}$.

6. The optically pumped atomic beam apparatus based on the curved four conductors according to claim 1, wherein an intensity of the static magnetic field is adjusted by changing an intensity of the working current.

* * * * *